United States Patent [19]

Banker et al.

[11] Patent Number: 4,531,067
[45] Date of Patent: Jul. 23, 1985

[54] PUSH-PULL DARLINGTON CURRENT SINK (PPDCS) LOGIC CIRCUIT

[75] Inventors: Dennis C. Banker, Newburgh; Frank A. Montegari, Wappingers Falls; John P. Norsworthy, Fishkill, all of N.Y.

[73] Assignee: International Business Machines Corporation, Armonk, N.Y.

[21] Appl. No.: 508,967

[22] Filed: Jun. 29, 1983

[51] Int. Cl.³ ............... H03K 19/013; H03K 19/082; H03K 19/20
[52] U.S. Cl. .................................... 307/454; 307/443; 307/455; 307/254; 307/563
[58] Field of Search ............... 307/443, 454, 455, 440, 307/457, 458, 254, 563, 466, 467

[56] References Cited

U.S. PATENT DOCUMENTS

| | | | |
|---|---|---|---|
| 3,505,535 | 4/1970 | Cavaliere | 307/455 |
| 3,577,073 | 5/1971 | Cray | 307/455 X |
| 4,283,640 | 8/1981 | Konian et al. | 307/454 X |
| 4,287,435 | 9/1981 | Cavaliere et al. | 307/455 X |
| 4,308,469 | 12/1981 | Cavaliere et al. | 307/455 |
| 4,409,498 | 10/1983 | Dorler et al. | 307/454 |

OTHER PUBLICATIONS

Dansky et al., "Current-Controlled Gate Push-Pull Dotting", IBM Tech. Discl. Bull., vol. 24, No. 6, pp. 3031-3034, 11/1981.
Montegari, "Darlington Current Sink", IBM Tech. Discl. Bull., vol. 20, No. 5, pp. 1764-1765, 10/1977.
Beranger et al., "Emitter Coupled Logic Gate With a Dual Current Source", IBM Tech. Discl. Bul., vol. 24, No. 1B, p. 511, 6/1981.
Dansky et al., "Active Pull-Down Circuit for Current-Controlled Gate", IBM Tech. Discl. Bull., vol. 24, No. 11A, pp. 5613-5618, 4/1982.
Gruddis et al., "Collector Drive Circuit With High-Input Impedance", IBM Tech. Discl. Bull., vol. 18, No. 11, pp. 3637-3638, 4/1976.

*Primary Examiner*—Larry N. Anagnos
*Attorney, Agent, or Firm*—Wesley DeBruin

[57] ABSTRACT

Logic circuit means for providing a binary output which is a predetermined logical function of a plurality of binary inputs, said logic circuit means including: at least first, second and third push-pull Darlington current sink (PPDCS) logic circuits, each said PPDCS logic circuit comprising: first, second and third transistors, each of said first, second and third transistors having an emitter, base and collector, said collector of said third transistor connected to a first source of potential and said emitter of said second transistor connected to a third source of potential; input circuit means, said input circuit means being adapted to receive n binary inputs, where n is a positive integer having a magnitude of two or greater, said input circuit means being connected to said collector of said first transistor and said base of said third transistor; a first resistor connected between said emitter of said first transistor and a second source of potential; a second resistor connected between said first source of potential and a common connection of said base of said first transistor and said base of said second transistor; a third resistor connected between said base of said third transistor and said first source of potential; a first diode connected across said base-collector junction of said first transistor; a second diode connected across said base-collector junction of said second transistor; output circuit means connected in common to said collector of said second transistor and said emitter of said third transistor, said output circuit means electrically manifesting the logical binary NOR function of said n binary inputs received by said input circuit means; and interconnection means interconnecting the output circuit means of each of said at least first, second and third PPDCS circuits, said interconnection means including an output terminal for manifesting said binary output of said logic circuit means.

3 Claims, 8 Drawing Figures

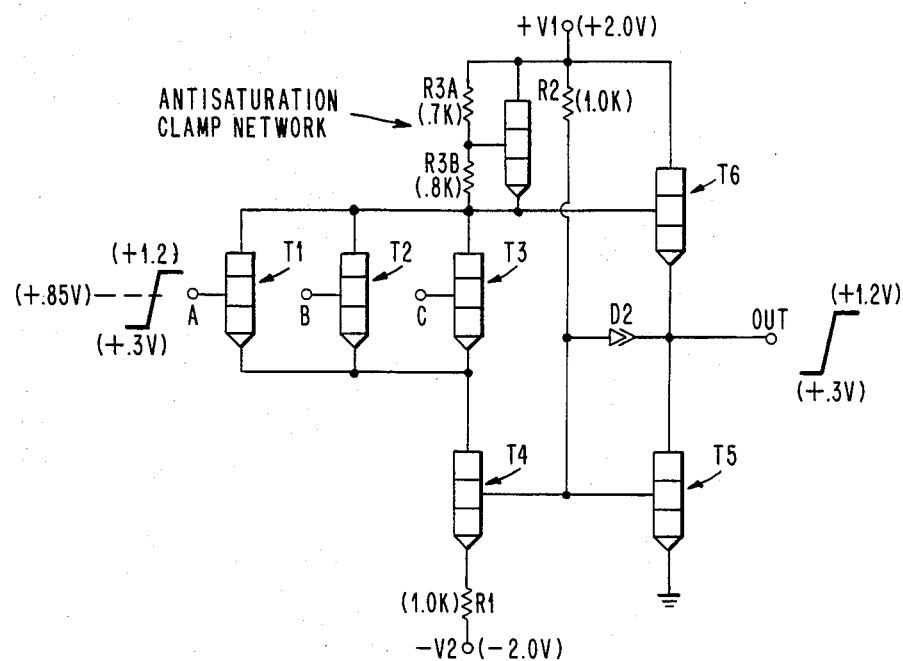
SECOND EMBODIMENT WITH ANTISATURATION CLAMP NETWORK
FIG. 2A
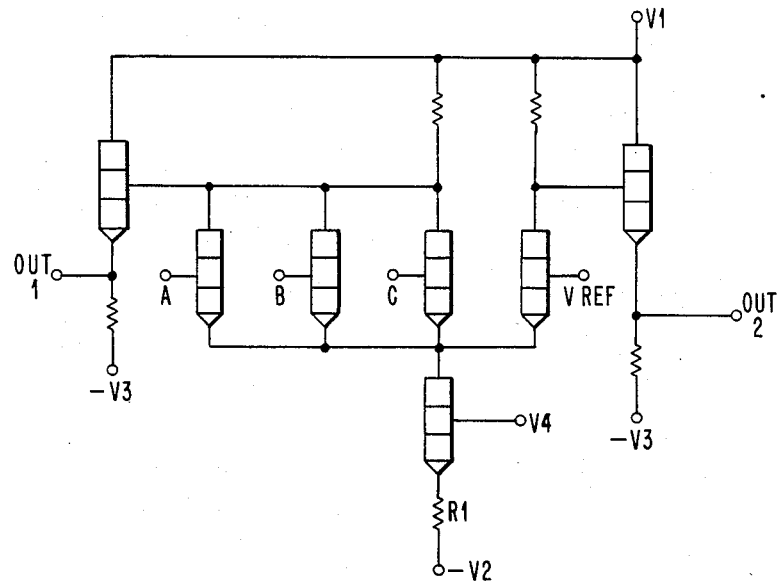
FIG. 3   TYPICAL ECL CIRCUIT

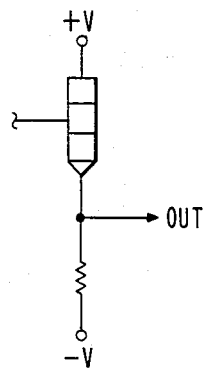
EMITTER FOLLOWER
FIG. 4A
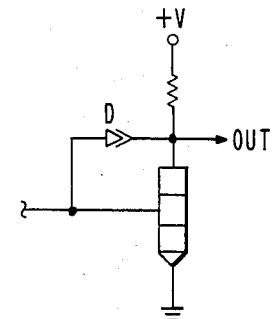
COMMON EMITTER
FIG. 4B
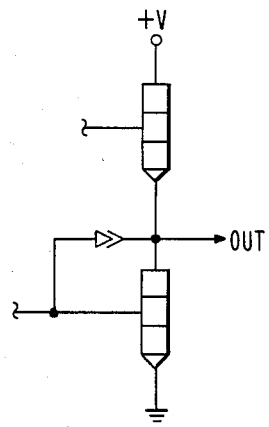
PUSH-PULL
FIG. 4C
OUTPUT SECTIONS
FIG. 4

4,531,067

PUSH-PULL DARLINGTON CURRENT SINK (PPDCS) LOGIC CIRCUIT

BACKGROUND OF THE INVENTION

1. Field of the Invention

An improved low voltage high speed logic circuit having a reliable low voltage push-pull output. The circuit employs a push-pull Darlington current sink and has improved noise tolerance.

2. Description of the Prior Art

Many integrated semiconductor circuits for performing the NOR (NAND) binary logical function are known to the art. A number of texts have been published which disclose the circuit design and operation of binary logical circuits. For example, two such texts are (1) "Designing with TTL Integrated Circuits" by Texas Instruments Incorporated Components Group, Copyright 1971, McGraw-Hill Kogakusha Ltd., and (2) "Digital Integrated Electronics" by Herbert Taub and Donald Schilling, Copyright 1977, McGraw-Hill, Inc.

Identified below are two U.S. patents, a pending U.S. patent application and a number of publications which disclose the fabrication and structure of binary logical circuits.

U.S. Pat. No. 3,509,363 entitled "Logic Switch with Active Feedback Network" granted Apr. 29, 1970 to Teh-Sen Jen et al.

U.S. Pat. No. 4,112,314 entitled "Logical Current Switch" granted Sept. 5, 1978 to V. L. Gani et al.

U.S. patent application Ser. No. 221,684, entitled "Transient Controlled Current Switch", filed Dec. 30, 1980 by J. A. Dorler et al and now U.S. Pat. No. 4,409,498 on Nov. 11, 1983.

"Darlington Current Sink" by F. Montegari, IBM Technical Disclosure Bulletin, Vol. 20, No. 5, Oct. 1977, pages 1764–5.

"Schottky Transistor Logic Circuit Receiver" by F. A. Montegari, IBM Technical Disclosure bulletin, Vol. 20, No. 11A, April 1978, pages 4374–5.

"Binary Switching Circuit" by J. L. Walsh, IBM Technical Disclosure Bulletin, Vol. 14, No. 1, June 1971, page 193.

"Collector Drive Circuit with High-Input Impedance" by A. J. Gruodis, IBM Technical Disclosure Bulletin, Vol. 18, No. 11, Apr. 1976, pages 3637–8.

"Transient Push-Pull Driver" by W. S. Klara et al, IBM Technical Disclosure Bulletin, Vol. 18, No. 11, Apr. 1976, page 3651.

"Current-Controlled Gate Push-Pull Dotting" by A. H. Dansky et al, IBM Technical Disclosure Bulletin, Vol. 24, No. 6, Nov. 1981, pages 3031–4.

"Low Voltage Current-Controlled Gate" by D. C. Banker et al, IBM Technical Disclosure Bulletin, Vol. 24, No. 11A, Apr. 1982, pages 5609–12.

"Active Pull-Down Circuit for Current-Controlled Gate" by A. H. Danksy et al, IBM Technical Disclosure Bulletin, Vol. 24, No. 11A, Apr. 1982, pages 5613–18.

"Complementary Current Switch" by F. A. Montegari, IBM Technical Disclosure Bulletin, Vol. 25, No. 3B, Aug. 1982, pages 1478–9.

No representation is made that the above identified application, patents and publications represent the only prior art or the most pertinent prior art.

SUMMARY OF THE INVENTION

An object of the invention is to provide an improved semiconductor integrated circuit for performing a logical binary function, such as NOR, NAND or NOT (Invert).

An object of the invention is to provide an improved semiconductor integrated logic circuit having reduced sensitivity to loading and utilizing the inherent device capacitances to accelerate the down going output transition.

An object of the invention is to provide an improved semiconductor integrated logic circuit which has low power dissipation and minimal propagation delay.

An object of the invention is to provide an improved semiconductor logic circuit which is readily fabricated by a reliable process well known to the art.

An object of the invention is to provide an improved semiconductor logic circuit which has particular utility in the fabrication of gate arrays.

A low voltage high speed logic circuit having reliable low voltage push-pull output. The circuit has far better noise tolerance than a TTL circuit. The push pull Darlington current sink uses the principle of feeding a signal into the collector of a current limiting transistor (T4) and produces a guaranteed fast turn-off of pull down transistor (T5) by connecting the emitter of the current source (T4) to a negative potential through a resistor (R1). The circuit also has particularly desirable characteristics for employment as an off-chip driver.

It is to be appreciated that the logic circuit, in accordance with the invention, may be employed as a NOR circuit in positive logic ("high level represents a binary '1'") or as a NAND circuit in negative logic ("low level represents a binary '1'"). The logical expression for a NOR circuit is $\overline{F}=A+B+C$, where F is binary output and A, B and C are binary inputs. The logical expression for NAND is $\overline{F}=A \cdot B \cdot C$, where F is a binary output and A, B and C are binary inputs.

The truth table is as follows:

| A | B | C | F(NOR) | F(NAND) |
|---|---|---|--------|---------|
| 0 | 0 | 0 | 1 | 1 |
| 0 | 0 | 1 | 0 | 1 |
| 0 | 1 | 0 | 0 | 1 |
| 0 | 1 | 1 | 0 | 1 |
| 1 | 0 | 0 | 0 | 1 |
| 1 | 0 | 1 | 0 | 1 |
| 1 | 1 | 0 | 0 | 1 |
| 1 | 1 | 1 | 0 | 0 |

The foregoing and other objects, features and advantages of the invention will be apparent from the following more particular description of the preferred embodiments as illustrated in the accompanying drawings.

BRIEF DESCRIPTION OF THE DRAWINGS

FIG. 2A discloses the circuit schematic of the second embodiment (FIG. 2) of a push-pull Darlington current sink logic circuit in accordance with the invention and employing an anti-saturation clamp network.

FIG. 3 discloses the circuit schematic of a typical (or representative) emitter coupled logic (ECL) circuit.

FIG. 4, which comprises FIGS. 4a, 4b and 4c, discloses three logic circuit output stages (or sections) which are respectively well known in the art. The "output stages" are respectively labelled "emitter follower", "common emitter" and "push-pull".

DESCRIPTION OF THE PREFERRED EMBODIMENTS

Figure 1:
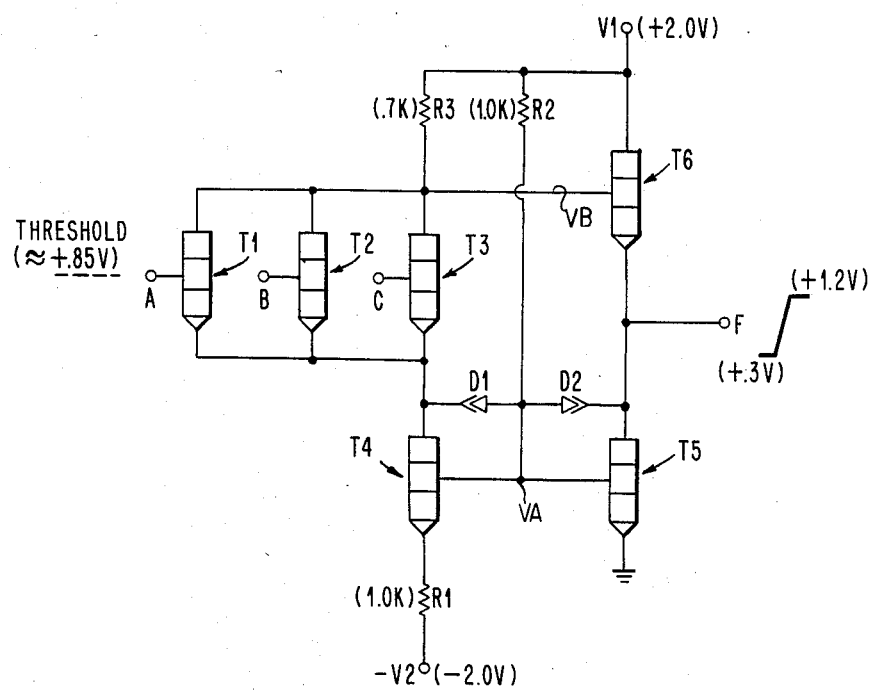
FIG. 1 discloses the circuit schematic of a first embodiment of a push-pull Darlington current sink logic circuit in accordance with the invention.
Figure 2:
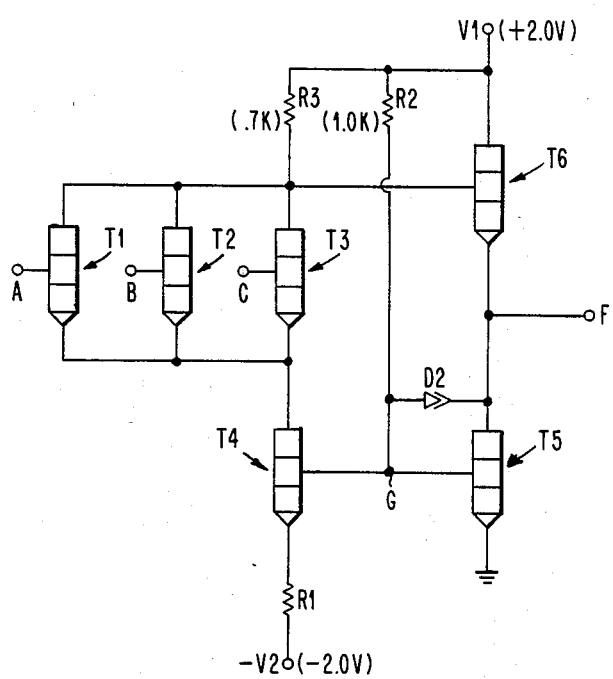
FIG. 2 discloses the circuit schematic of a second embodiment of a push-pull Darlington current sink logic circuit in accordance with the invention.

The Push Pull Darlington Current Sink (PPDCS), logic circuit, FIGS. 1, 2 or 4, offers many advantages over digital logic circuits presently used in digital equipment, such as the fastest computers. If one were to survey the field of high speed computers, he would find that these machines are frequently constructed around the Emitter Coupled Logic (ECL, FIG. 3) circuit. The circuitry, as shown in FIG. 3, has also been called the Current Switch Emitter Follower (CSEF) circuit and fabricated in a highly integrated and advanced bipolar process. It is the trend in this field to employ the 'logic masterslice' or 'gate array' approach, in the effort to realize greater levels of integration. The PPDCS logic circuit, in accordance with the invention, represents an advancement of the art over existing technologies such as ECL.

In order to extend the art, a logic circuit must have minimal propagation delay. The propagation delay of a circuit may be thought of as being composed of two parts: the unloaded delay, and the added delay due to loading (e.g. fanout, wiring capacitance, etc.). The delay per unit load is called the sensitivity due to loading (e.g., 150 ps/pF, or 100 ps/fan-out). The PPDCS logic circuit minimizes this sensitivity to loading by providing a push-pull output section, and embodiments where inherent device capacitances are exploited to accelerate the down going output transition. Its characteristic low sensitivity to capacitive loading makes it ideal for gate array applications, since delays can be well predicted before any circuits are automatically wired. If, for example, a logic gate in the critical path of a synchronous computing machine had excessive capacitive loading at its output after automatic placement and wiring, the desired machine cycle would not suffer greatly.

Thus, the utility of the PPDCS circuit in accordance with the invention is in the implementation of very high speed digital equipment, such as computers. Its advantage is in its lesser delay and lower power dissipation when compared to existing bipolar circuit technologies. A further advantage of the PPDCS circuit is that it may be readily fabricated by a high yield reliable known process.

The advantages of a push-pull output section over an emitter follower or common emitter with passive pullup (FIGS. 4a, 4b, and 4c) are well known, and as such, we will treat this matter only briefly. In order to derive high speed from an emitter follower (an analogous discussion holds for the common emitter) the pull down resistor must be made small. Although this pull down resistor may be made small enough such that it is about equivalent in impedance to an active transistor pulling down, power dissipation becomes so high as to be prohibitive or unpractical. This high power dissipation adversely affects the ability to pack circuits densely on a chip, and therefore adversely affects the performance of the computer (or other equipment) implemented in the technology. In order to obtain high performance in an ECL circuit, the power dissipation of the output section must be made large. By comparison, the power dissipation of the output section of the PPDCS circuit is negligible, while its performance is as fast as the fabrication process permits. This reduction in power concurrent with an increase in performance allows for a much faster computer, due to higher levels of integration as well as reduced circuit delay.

For the following discussion, we will refer to devices as labelled in the figures representing the PPDCS circuit. We will adopt a convention for specifying the currents and voltages in the circuit in accordance with the following examples:

IR3 . . . current in resistor R3
IB1 . . . base current in transistor T1
IE3 . . . emitter current in transistor T3
IC3 . . . collector current in transistor T3
VBE2 . . . base to emitter voltage of transistor T2
VBC3 . . . base to collector voltage of transistor T3

We will first consider the operation of the first embodiment of the circuit (FIG. 1). Like most digital logic circuits, there are two output levels defined, a high level representing one binary value, and a low level defining the other. A high level is defined as $(+V1-VBE6)$, while a low level is defined as $(ground+VBE5-VD2)$.

Whenever one or more of the bases of T1, T2 or T3 are high, T6 is off and T5 is on, resulting in a low output. The logic function implemented is thus the 'NOR' function. In this state, VA is clamped at $(ground+VBE)$ by device T5, with base drive supplied by R2. The current in the input section is then $((VA-VBE)/R1)$, which implies that R3 must be scaled relative to R1 to both avoid saturation of input devices T1, T2 and T3, as well as insuring that node voltage VB is low enough to keep T6 off.

The condition where all of the inputs are low defines the opposite state of the circuit, that is when the output is high. In this state, the input devices are off, and VB rises to about $+V1$. T6 then provides emitter follower drive for the up-level. T5 is off, and VA is about $((R1/(R1+R2))\times(V1-(-V2)-VBE4))+-VBE4+(-V2)$. This expression illustrates the design dependencies of R2 and R1, in maintaining T5 in the off state while the output is high. Devices D1 and D2 serve merely as antisaturation clamping diodes. D1 and D2 are preferably low forward voltage (300 MV.) Schottky barrier diodes.

From the above discussion, it is evident that a particular utility of the complex appearing network, consisting of R2, T4, and R1, exists beyond merely turning T5 off, which is the general nature in which the output levels may be adjusted, as well as giving the capability of lowering the supply voltage. Lowering the supply voltage generally lowers the power dissipation of the circuit, while narrowing the signal swing improves the speed of the circuit, allowing the designer to trade off noise margin and speed.

The second embodiment, FIG. 2, of the circuit has similar DC characteristics as the first, FIG. 1, with the only difference being the absence of clamp diode D1. This allows device T4 to saturate, thus capacitively coupling the base of output device T5 to the emitters of the input devices. The effect of this is that the input devices drive the output devices essentially directly in emitter follower fashion. The 'output falling' is thus speeded up greatly. It should be noted that if large base to collector capacitances result from the saturation of T4, then an antisaturation clamp network as shown in FIG. 2a should be used. (This clamp is fully disclosed and described in U.S. Pat. No. 3,505,535 entitled "Digital Circuit With Anti-saturation Collector Load Network" granted Apr. 7, 1970 to J. R. Cavaliere.) This will prevent the input devices from saturating when one of inputs are rising, and a current surge is present to drive T5.

Figure 5:
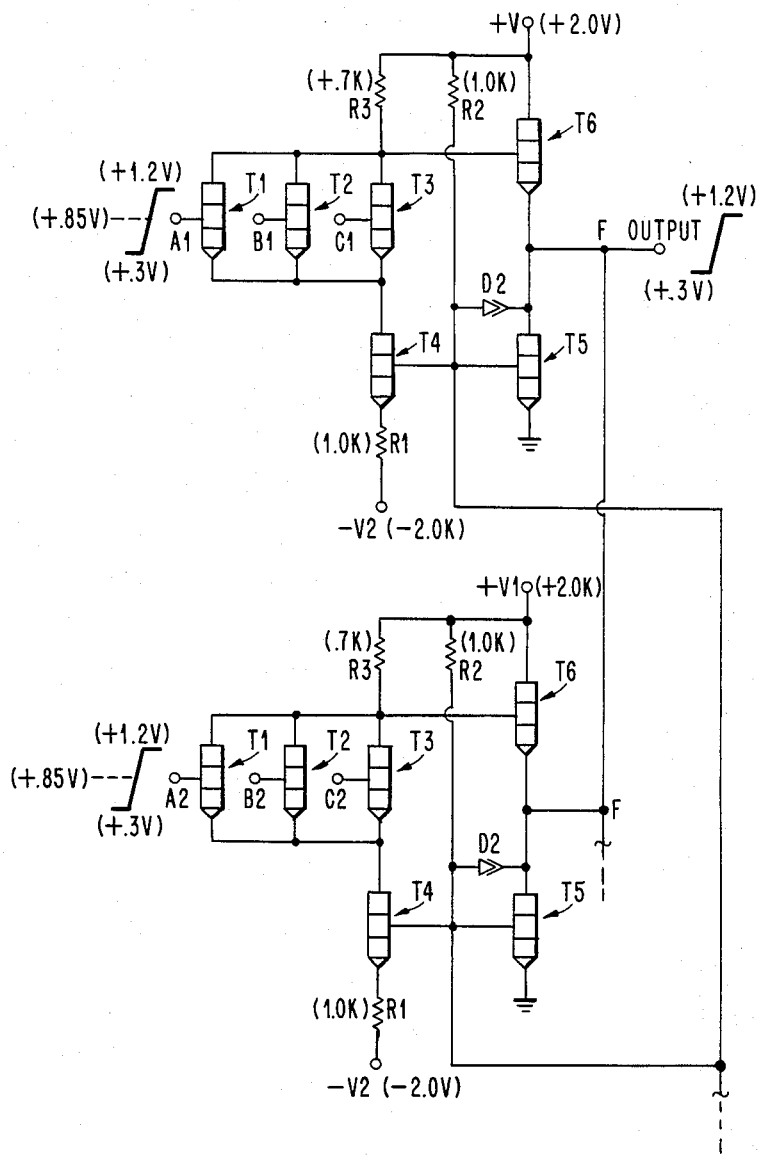
FIG. 5 discloses the circuit schematic of two, or more, push-pull Darlington current sink logic circuits, "dotted" together and retaining their push-pull operation, all in accordance with the invention.

The PPDCS circuit may be "dotted" with another PPDCS circuit and still retain push-pull operation. This is a 'two wire' dot, performed as shown in FIG. 5. In push-pull dotting, an undesirable situation results when an emitter follower is pulling up while a common emitter is pulling down. This situation is prevented by the connection of the bases of the output devices (T5). If all of the inputs of one of the dotted circuits are down, then a current path through the parallel R2s, through the saturated T4, keeps both of the output devices off.

The above discussion describes a circuit which extends the art noticeably beyond the current state as manifested by ECL. These differences stem from push-pull operation, capacitive coupling through the saturated T4, and the ability of performing a push-pull dot. The lower power dissipation, and relative insensitivity to loading of the PPDCS circuit are consistent with the computer industry's drive to higher levels of integration, and the use of 'gate array' techniques.

To reiterate, in the embodiment of FIG. 2, T4 is preconditioned in a saturated mode when all inputs are down, prior to turning the circuit on by raising one or more of the inputs to an up level. Saturation of T4 occurs when all inputs are down and a high impedance exists in the collector circuit of T4. Current flows from R2 into the base-collector junction of T4, thus forward biasing the junction and producing a high diffusion capacitance. The current then flows through R1 into $-V2$, producing a low voltage at node G which turns T5 off.

A low impedance path to ground now exists in the emitter circuit of the input transistors, through the base-collector capacitance of T4, and the base-emitter junction of T5. When one or more inputs are raised, this low emitter circuit impedance allows T1, T2, or T3 to turn on fast, providing a fast down-going transition at the base of emitter-follower T6. Simultaneously, current fed through the base-collector capacitance of T4 into the base-emitter junction of T5 causes T5 to turn on fast. The combination of T4 turning off fast and T5 turning on fast produces an extremely rapid down-going transition at the output. The emitter of T4 is also pulled up by the current fed into its collector, which depletes the saturation capacitance leaving only a small base-emitter current. The voltage at node G is then clamped to one VBE above ground by T5, with D2 serving to prevent T5 from saturating.

As stated hereinabove, this circuit may be "dotted" with another circuit and still retain push-pull operation. This is a "two wire dot", which is shown in FIG. 5. In push-pull dotting, an undesirable condition results when an emitter follower is pulling up while a common emitter is pulling down. This situation is prevented by the connection of the bases of the output devices (T5). If all of the inputs of one of the dotted circuits are down, then a current path through the parallel R2s, through the saturated T4, keeps both of the output devices off. It is to be appreciated that the specific resistance values of the resistors ($R_1$, $R_2$, $R_3$ etc.) and voltage magnitudes of the potentials ($V_1$, $V_2$) enclosed within parenthesis on the drawing, are merely representative and provided for ease of understanding of the operation of our invention. The values set forth on the drawing are not to be construed as limiting the scope and spirit of our invention.

Although FIG. 5 for convenience of explanation depicts only two PPDCS circuits "dotted", it will be appreciated by persons skilled in the art that more than two PPDCS circuits may be "dotted".

The above discussion describes a circuit with operating characteristics notably superior to the prior art of "Darlington Current Sink" by F. Montegari, IBM Technical Disclosure Bulletin, Vol. 20, No. 5, Oct. 1977, pages 1764-5. The superior performance stems from push-pull operation, capacitive coupling through the saturated T4, and the ability to perform a "push-pull dot".

While the invention has been particularly shown and described with reference to the preferred embodiments thereof, it will be understood by those skilled in the art that various changes in form and detail may be made without departing from the spirit and scope of the invention.

What is claimed is:

1. A low voltage high speed logical NOR circuit having a highly reliable push-pull output and improved noise tolerance, said circuit comprising:

first, second and third transistors, each of said first, second and third transistors having an emitter, base and collector, said collector of said third transistor connected to a first source of potential V1, and said emitter of said second transistor connected to a third source of potential V3;

input circuit means, said input circuit means receiving n binary inputs, where n is a positive integer having a magnitude of two or greater, said input circuit means connected to said collector of said first transistor and said base of said third transistor, said input circuit means comprising n transistors, each of said n transistors having an emitter, base and collector, said collector of each of said n transistors being directly connected to said base of said third transistor, said emitter of each of said n transistors being directly connected to said collector of said first transistor, and said base of each of said n transistors receiving a discrete one of said n binary inputs;

a first resistor R1 connected between said emitter of said first transistor and a second source of potential V2;

a second resistor R2 connected between said first source of potential V1 and a common connection of said base of said first transistor and said base of said second transistor;

a third resistor R3 connected between said base of said third transistor and said first source of potential;

a diode connected across said base-collector junction of said second transistor;

an output terminal connected in common to said collector of said second transistor and said emitter of said third transistor, said output terminal electrically manifesting the logical binary NOR function of said n binary inputs received by said input circuit means; and said low voltage high speed logical NOR circuit being further characterized in that the magnitude of the potential provided by said first (V1), second (V2) and third (V3) sources of potential bear the following relationship, one to another, V1>V3>V2, and the magnitude of the resistance of said first (R1), second (R2) and third (R3) resistors bear the ratio (R1/R2/R3) one/one/seven-tenths (1/1/0.7), one to another.

2. A low voltage high speed logical NOR circuit, as recited in claim 1, wherein said first source of potential V1 has a magnitude of +2.0 volts, said second source of potential V2 has a magnitude of −2.0 volts and said third source of potential V3 has a magnitude of 0 volts.

3. A low voltage high speed logical circuit, as recited in claim 1, wherein said first resistor (R1) has a resistance of 1.0K ohms, said second resistor (R2) has a resistance 1.0K ohms, and said third resistor (R3) has a resistance of 0.70K ohms.

* * * * *